(12) United States Patent
Janse et al.

(10) Patent No.: US 10,477,313 B2
(45) Date of Patent: Nov. 12, 2019

(54) AUDIO SIGNAL PROCESSING

(71) Applicant: KONINKLIJKE PHILIPS N.V., Eindhoven (NL)

(72) Inventors: Cornelis Pieter Janse, Eindhoven (NL); Leonardus Cornelis Antonius Van Stuivenberg, Helmond (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/761,448

(22) PCT Filed: Sep. 19, 2016

(86) PCT No.: PCT/EP2016/072099
§ 371 (c)(1),
(2) Date: Mar. 20, 2018

(87) PCT Pub. No.: WO2017/050669
PCT Pub. Date: Mar. 30, 2017

(65) Prior Publication Data
US 2019/0052959 A1    Feb. 14, 2019

(30) Foreign Application Priority Data

Sep. 22, 2015   (EP) .................................... 15186269

(51) Int. Cl.
*G01L 21/02* (2006.01)
*H04R 3/00* (2006.01)
(Continued)

(52) U.S. Cl.
CPC ................ *H04R 3/04* (2013.01); *G10L 21/02* (2013.01); *G10L 21/0232* (2013.01);
(Continued)

(58) Field of Classification Search
CPC ......... H04R 3/00; H04R 3/04; G10L 19/0204; G10L 21/00; G10L 21/02; G10L 21/0232;
(Continued)

(56) References Cited

U.S. PATENT DOCUMENTS

| | | | |
|---|---|---|---|
| 2001/0051870 A1* | 12/2001 | Okazaki | G10L 21/003 704/207 |
| 2002/0032571 A1* | 3/2002 | Leung | G10L 21/0364 704/503 |

(Continued)

FOREIGN PATENT DOCUMENTS

| | | |
|---|---|---|
| EP | 0721251 A1 | 7/1996 |
| EP | 2200180 A1 | 6/2010 |
| WO | 2004017303 A1 | 2/2004 |

OTHER PUBLICATIONS

Gilloire, A. et al., "Adaptive filtering in subbands with critical sampling: Analysis, experiments, and application to acoustic echo cancellation", IEEE Transactions on Signal Processing, IEEE Service Center, New York, NY, vol. 40, No. 3, 1992.

(Continued)

*Primary Examiner* — Thang V Tran

(57) ABSTRACT

An audio signal processing apparatus comprises a receiver (403) receiving an audio signal sampled at a first sampling frequency, the audio signal having a maximum frequency below half the first sampling frequency by a first frequency margin. A filter bank (405) generates subband signals for the digital audio signal using overlapping sub-filters. A first frequency shifter (407) applies a frequency shift to at least one subband of the set of subbands and a decimator (409) decimates the subband signals by a decimation factor resulting in a decimated sampling frequency being at least twice a bandwidth of each of the overlapping sub-filters. The frequency shift for a subband is arranged to shift the subband to a frequency interval being a multiple of a frequency (Continued)

interval from zero to half the decimated sample frequency. The subband may be individually processed and the processed subbands may subsequently be combined to generate a full band output signal.

15 Claims, 11 Drawing Sheets

(51) Int. Cl.
  *H04R 3/04* (2006.01)
  *G10L 21/02* (2013.01)
  *G10L 21/0232* (2013.01)
  *G10L 21/038* (2013.01)
  *H03H 17/02* (2006.01)
  *G10L 21/0208* (2013.01)

(52) U.S. Cl.
  CPC .. *G10L 21/038* (2013.01); *G10L 2021/02082* (2013.01); *H03H 17/0266* (2013.01)

(58) Field of Classification Search
  CPC ........ G10L 21/038; G10L 2021/02082; H03H 17/0248; H03H 17/0266; H03H 17/0294
  See application file for complete search history.

(56) References Cited

U.S. PATENT DOCUMENTS

| 2003/0202600 | A1* | 10/2003 | Sato ................... G10L 19/0204 375/240.21 |
| 2006/0034447 | A1 | 2/2006 | Alves et al. |
| 2007/0237335 | A1* | 10/2007 | O'Sullivan ............... H04S 7/00 381/63 |
| 2008/0225168 | A1* | 9/2008 | Ouslis ................. H04N 5/4401 348/554 |
| 2008/0225170 | A1* | 9/2008 | Silver .................. H04N 5/4401 348/555 |
| 2008/0225175 | A1* | 9/2008 | Shyshkin ............. H04N 5/4401 348/572 |
| 2011/0023691 | A1* | 2/2011 | Iwase .................... G10H 1/0066 84/612 |
| 2012/0076323 | A1* | 3/2012 | Disch ................... G10L 19/025 381/97 |
| 2013/0090933 | A1* | 4/2013 | Villemoes ........... G10L 19/0204 704/500 |
| 2013/0305908 | A1* | 11/2013 | Iwase .................... G10H 1/0066 84/624 |
| 2016/0240183 | A1* | 8/2016 | Noh ....................... H03G 5/005 |

OTHER PUBLICATIONS

P.P. Vaidyanathan, Multirate systems and filter banks, Section 5.1, Prentice Hall 1993.
A.V. Oppenheim, R.W. Schafer, Digital Signal Processing, Section 7.4, Prentice Hall 1975.
S.K. Mitra, J.F. Kaiser Eds, Handbook for Digital Signal Processing, Section 13-2, John Wiley & Sons, 1993.

* cited by examiner

AUDIO SIGNAL PROCESSING

CROSS-REFERENCE TO PRIOR APPLICATIONS

This application is the U.S. National Phase application under 35 U.S.C. § 371 of International Application No. PCT/EP2016/072099, filed on 19 Sep. 2016, which claims the benefit of European Patent Application No. 15186269.5, filed on 22 Sep. 2015. These applications are hereby incorporated by reference herein.

FIELD OF THE INVENTION

The invention relates to a method and apparatus for audio signal processing and in particular, but not exclusively to processing of audio speech signals.

BACKGROUND OF THE INVENTION

Digital processing of audio signals has become increasingly prevalent and is now part of many practical applications. Indeed, it is currently performed in many everyday consumer electronic devices including for example mobile phones, music distribution and rendering, television, etc.

In order to provide improved, new, or more flexible processing, the used audio processing algorithms tend to become increasingly complex and indeed in many scenarios the signal processing is limited by the available computational resource. An example is speech signal processing for speech communication devices where speech coding together with speech enhancement typically consumes a very substantial part of the computational resource. Therefore there is a general desire to improve the computational efficiency of audio processing algorithms.

In some applications and scenarios, processing of a digital audio signal may advantageously be performed in parallel subbands. As the subbands have a reduced bandwidth, such processing may be performed on decimated subband signals, i.e. the sample frequency can be reduced. For example, an audio signal may be divided into two equal subbands with the subband signals being decimated by a factor of two before being individually processed.

As a specific example, a speech signal may be divided into two separate components corresponding respectively to a lower frequency band and a higher frequency band. The encoding may then be performed individually in each band, i.e. it may be performed by applying individual and separate audio processing to the two subband signals. As another example, an echo cancellation process may be performed individually in different subbands.

Following the processing of the individual subbands, these may be combined again to generate a single full band processed audio signal with the same sampling frequency as for the input signal.

The processing of an audio signal by dividing the signal into subbands and applying a processing individually in the different subbands may provide substantial benefits in many scenarios.

For example, for many processing algorithms the computational resource usage does not scale linearly with the frequency bandwidth or sampling frequency. Indeed, for many processing algorithms, the computational requirement may increase e.g. with the square of frequency bandwidth/sampling frequency.

Another advantage of subband processing is that it may allow the processing to be more closely adapted to the different characteristics of the audio signal. For example, a speech signal has very different properties in the frequency range up to, say, 4 kHz than it has in the frequency range above 4 kHz. Therefore, improved speech coding may often be achieved by the encoding algorithm being targeted at the specific characteristics in the different frequency bands, and thus a different encoding for a subband below 4 kHz than for a subband above 4 kHz may be applied. For example, a different speech model may be used.

Also, by operating in different subbands it may be possible to optimize the computational efficiency by adapting the processing to the different characteristics. For example, reverberation is known to last for much longer for lower frequencies than for higher frequencies. Therefore, a reverberation estimation filter (as e.g. used in an echo canceller) for low frequencies needs to have enough coefficients (for a FIR filter) to provide an impulse response sufficient to model a long reverberation effect. However, by splitting the audio signals into e.g. a low frequency and high frequency band, the long filter need only to be applied to the low frequency band (at a decimated sample rate) whereas a much shorter filter (reflecting the short high frequency reverberation) can be applied in the high frequency band (at the decimated sample rate). The overall computational resource usage can in this way be substantially reduced in comparison to filtering the full bandwidth signal at the full sample rate using the long reverberation filter.

There is currently a trend towards increasing the bandwidth of audio signals (e.g. for speech or music audio) and this tends to result in a substantially increased computational resource usage due to the increased sample rate. The importance of using subband processing may increase for increasing bandwidth of the audio signal and indeed it may in many cases even allow audio processing to be performed which due to resource constraints in the device cannot be performed for a full rate higher bandwidth signals.

For example, the bandwidth of (hands-free) speech communication devices is rapidly increasing. Narrowband (4 kHz bandwidth) and wideband (8 kHz) systems are extensively used, but super wideband (16 kHz) and even full band (24 kHz) systems are entering the market (especially for VoIP applications).

As a specific example, speech enhancement algorithms have to cope with this increase in bandwidth. Using the same speech enhancement algorithm for the whole frequency band poses some challenges. The speech enhancement problems to solve are different for the high and low frequencies. Take for example a super wideband algorithm, with a bandwidth of 16 kHz. The speech signal in the range from 0 to 8 kHz is quite different from the speech signal in the range from 8 to 16 kHz. Vowels with their important first three formants predominantly exist in the lower band whereas some consonants extend significantly beyond 8 kHz. Also the frequency selectivity of the human hearing is much higher at the lower frequencies.

As another example, the acoustics of a room normally changes with frequency, mostly due to an increase of the air absorption with increasing frequency. As a result, the reverberation time at high frequencies will be lower for the higher frequencies. As a consequence de-reverberation is especially important for the lower frequencies. The adaptive filter length for e.g. acoustic echo cancellation can accordingly be shorter for the higher frequencies as reverberation is typically much shorter for higher frequencies.

E.g. for acoustic echo cancellation, extending the bandwidth, and thus the sample frequency, by a factor of two and then applying the same algorithm leads to an increase of the adaptive filter length by a factor of two in order to realize the same echo compensation for the low frequency band.

For super wideband speech echo cancellation, filter lengths of 4096 or more are typically needed. The adaptive filters need good de-correlation properties to allow fast adaptation. In essence, this means that the update term of the adaptive filter has to be de-convolved with the autocorrelation of the input signal (loudspeaker signal). Due to the low levels of speech in the high frequency bands, this autocorrelation has a long support in the time domain and leads to non-perfect decorrelation and thus lower adaptation speeds for the high frequencies.

An attractive solution for such applications is to split the signals into separate frequency bands, by applying a filter bank. In such a filter bank, the signals can be divided into e.g. two (for super wideband) or three (for fullband) subbands which are subsequently downsampled (decimated), and then processed separately. After the separate processing, the resulting processed signals are upsampled and recombined.

As mentioned, the split into distinct bands offers the advantage that each band can be processed independently reflecting the specific characteristics in each band. E.g., the processing of the band from 0 to 8 kHz can be exactly the same as for the wideband case, and for the higher frequencies different processing is possible. In particular, for acoustic echo cancellation an adaptive filter of typically 2048 coefficients for the band from 0 to 8 kHz can still be used, whereas for example 1024 coefficients can be used for the band from 8 to 16 kHz. This can be compared to a single band solution typically employing 4096 coefficients for super wideband or even 6144 coefficients for full band.

However, a problem with such subband processing is that the audio signal in principle should be divided into subbands using ideal filters (i.e. non-overlapping filters with infinitely sharp transitions). As this is not possible, some overlap between filters typically results leading to some signal frequencies of the original signal being present in two neighbouring subband signals.

A particular problem of the non-ideal filtering is that aliasing may typically occur as part of the decimation. The decimated frequency is preferably as low as possible, and typically it is set to correspond to the original sampling frequency divided by the number of subbands. However, when using non-ideal filters in such situations, some aliasing of frequency components for one subband into another subband is unavoidable.

However, this aliasing can be addressed by the synthesis unit (generating the output digital audio signal from the processed subband signals) including complementary filters that cancel out the alias components. Therefore, the aliasing resulting from non-ideal filters is conventionally addressed by choosing filters in the synthesis functionality for generating the full bandwidth signal which results in the aliasing being cancelled.

However, despite such compensation, the inventors have realized that it is still a desire to provide improved audio signal processing. In particular, an improved audio signal processing would be advantageous and in particular audio processing allowing increased flexibility, reduced complexity, reduced computational resource use, and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided an audio signal processing apparatus comprising: a receiver for receiving an audio signal sampled at a first sampling frequency, the audio signal having a maximum frequency not exceeding a threshold frequency being lower than half the first sampling frequency by a first frequency margin; a filter bank for generating subband signals for the digital audio signal, the filter bank comprising a set of overlapping sub-filters providing a set of subbands; a first frequency shifter for applying a frequency shift to at least one subband of the set of subbands; a decimator for decimating the subband signals by a decimation factor resulting in decimated subband signals having a decimated sampling frequency equal to the first sampling frequency divided by the decimation factor, the decimated sampling frequency being at least twice a bandwidth of each of the overlapping sub-filters; and wherein the frequency shift for a subband is arranged to shift the subband to a frequency interval being a multiple of a frequency interval from zero to half the decimated sample frequency.

The invention may provide improved and/or facilitate processing of audio signals for many applications, and may in many scenarios provide improved audio quality. The approach may specifically allow subband processing of an audio signal with reduced subband aliasing components while still allowing the subband division to represent the entire frequency spectrum of the audio signal without gaps. Specifically, in many embodiments, the approach may facilitate, improve or allow subband processing without subband aliasing components while still providing a substantially flat overall frequency response for the division into subbands.

The subband processing may for example allow the processing to be adapted to the specific characteristics of the audio signal in different frequency intervals. For example, filter lengths may be customized to reflect the specific requirements in the individual subband rather than the overall worst case requirement for the audio signal. The processing of a signal in subbands may typically reduce complexity and computational resource requirements substantially. The reduction of subband aliasing may provide improved separation between the individual subbands which in many embodiments may result in improved performance, such as e.g. improved adaptation of individual subband adaptive filters.

The exact order or sequence of the individual operations may vary in different embodiments. For example, in most embodiments, the decimator is arranged to perform the decimation after the frequency shift. However, in some embodiments, the frequency shift may be performed as part of, or even in some situations, after the decimation.

The shifting of the subband to a frequency interval being a multiple of a frequency interval from zero to half the decimated sample frequency may specifically be shifting a bandwidth of the subfilter for the subband to be within the multiple of a frequency interval from zero to half the decimated sample frequency. The bandwidth may e.g. be a 6 dB, 10 dB, 20 dB, or 30 dB bandwidth. The bandwidth considered may depend on the individual embodiment and e.g. on the acceptable level of aliasing components and requirements of the processing.

Each subband is associated with a frequency interval of the input audio signal. The individual subband may be moved/shifted in frequency in that the frequency of the subband signal may be changed. However, although the frequency of the subband or subband signal may be changed, the subband still corresponds to/represents the same frequency interval of the audio signal.

The references to frequencies refer to positive frequencies. It will be apparent to the skilled person how, for real physical time domain signals with Hermitian property in the frequency domain, such frequencies are related to negative frequencies.

The frequency interval being a multiple of a frequency interval from zero to half the decimated sample frequency includes a multiple of one, i.e. it includes the frequency interval from zero to half the decimated sample frequency.

The number of subbands may in many embodiments advantageously be two subbands. Typically, a relatively low number of subbands are used, and often the number is no more than five. The threshold frequency may in many embodiments be no more than 20 kHz, 14 kHz, 12 kHz, 10 kHz, 8 kHz or 6 kHz. In many embodiments, the bandwidth of each subband is advantageously no less than 1 kHz, 2 kHz, 4 kHz, 6 kHz or 8 kHz.

In accordance with an optional feature of the invention, the audio signal processing apparatus further comprises a signal processor arranged to apply a signal processing algorithm to the audio signal by applying separate subband signal processing in each subband.

The invention may provide improved and/or facilitated subband processing of a signal with reduced aliasing between subbands. The subband processing may include processing of other signals which may or may not be converted into corresponding subbands using the same approach.

In accordance with an optional feature of the invention, the signal processing algorithm is a speech processing algorithm, and the signal processor is arranged to apply different algorithms in different subbands.

The invention may provide a particularly advantageous speech processing where the processing in each subband can be adapted to the specific characteristics of speech in different frequency bands. Speech properties vary substantially between different subbands and subband processing without aliasing components may provide a particularly efficient processing with improved quality and/or reduced complexity/resource usage.

The speech processing may in particular be speech encoding or speech enhancement.

In accordance with an optional feature of the invention, the signal processing algorithm comprises applying an adaptive filter, and the signal processor is arranged to adapt the adaptive filter separately in different subbands.

The approach may provide a particularly effective adaptation to varying audio properties in different frequency intervals. The adaptive filter may comprise an adaptive subfilter for each subband and the apparatus may be arranged to generate a filter update signal for each subband with the corresponding adaptive subband filter being updated in response to the filter update signal for that subband.

In accordance with an optional feature of the invention, the audio signal and the adaptive filter is an echo cancellation filter for estimating an echo of the audio signal, the echo cancellation filter comprising a sub-echo cancellation filter for each subband; and the signal processor is arranged to: determine estimated echo signals for each subband by applying a sub-echo cancellation filter to the decimated subband signal in each subband; determine an error signal for each subband by comparing the estimated echo signal in each subband to a captured audio signal comprising an echo of the audio signal; and updating each sub-echo cancellation filter in response to the error signal for the corresponding subband.

The approach may yield a high performance and effective echo cancellation while maintaining low complexity and resource usage.

In accordance with an optional feature of the invention, the audio signal processing comprises a synthesizer for synthesizing an audio output signal at the first sampling frequency from processed subband signals generated by the subband signal processing in each subband; the synthesizer comprising: an upsampler for upsampling the processed subband signals to the first sampling frequency to generate upsampled processed subband signals; a second frequency shifter for applying a reverse frequency shift to the upsampled processed subband signals, the reverse frequency shift for a first subband resulting in the first subband being shifted to a frequency range of the sub-filter for the first subband; a subband merger for merging, following the application of the reverse frequency shift, the upsampled processed subband signals to generate a processed audio signal; a set of subband filters for filtering the upsampled processed subband signals to attenuate upsample alias spectra for each subband, each filter of the set of filters having a bandwidth not exceeding half the first sampling frequency.

The approach may provide a highly advantageous approach where a full band audio signal can be processed by subband processing with artefacts or degradations caused by the subband processing being mitigated. In particular, the effect of subband aliasing may be reduced very substantially.

In accordance with an optional feature of the invention, the subband merger comprises at least one of the set of subband filters, and a combiner for generating the processed audio signal by combining the upsampled processed signals subband following the subband filtering.

This may provide a particularly efficient processing in many embodiments.

In accordance with an optional feature of the invention, the frequency shift for a first subband is substantially given as:

$$f_s = \frac{f_d}{4} + n\frac{f_d}{2} - f_m$$

where $f_d$ is the decimated sample frequency, $f_m$ is a centre frequency of the first subband prior to frequency shifting and n is an integer (n≥1).

This may provide a particularly efficient approach and may in many embodiments result in an increased attenuation of subband alias components.

In many embodiments, the frequency shift for a subband may be such that a center frequency of the subband is shifted to a frequency of substantially the decimated sample frequency plus a multiple of half the decimated sample frequency.

In accordance with an optional feature of the invention, an attenuation of a sub-filter for a first subband is no less than 6 dB at a frequency of a multiple of half the decimated sample frequency shifted by a value corresponding to the frequency shift.

This may allow a highly efficient attenuation of subband alias components in the subband signals. In many embodiments, the attenuation of a sub-filter for a first subband may be no less than 10 dB, 20 dB, or 30 dB at a frequency of a multiple of half the decimated sample frequency shifted by a value corresponding to the frequency shift.

In accordance with an optional feature of the invention, the filter bank is formed by a set of substantially power complementary sub-filters.

This may reduce distortion of the full band audio signal. The substantially power complementary sub-filters may in many embodiments be power complementary to within an accuracy of 1 dB to 2 dB. Thus, in many embodiments, the filter bank provides an overall combined response which is flat to within 1 dB or 2 dB.

In many embodiments, a combined filter formed by a combination of overlapping filters have a passband amplitude variation of no more than 2 dB (or in many embodiments no more than 1 dB).

In accordance with an optional feature of the invention, each filter of the set of sub-filters has a 6 dB bandwidth not exceeding half the decimation frequency.

This may provide efficient operation with efficient attenuation of subband alias components. In many embodiments, each filter of the set of sub-filters may have a 10 dB, 20 dB, or 30 dB bandwidth not exceeding half the decimation frequency In accordance with an optional feature of the invention, the threshold frequency is no less than 10% lower than half the first sampling frequency.

This may provide a practical overhead in many embodiments and may allow effective filtering by practical filters to attenuate subband alias components to sufficient levels. In many embodiments, the threshold frequency is no more than 90% of the first sampling frequency. In many embodiments, the threshold frequency is no less than 60% of the first sampling frequency. This may maintain low complexity by not employing too high sampling frequencies.

According to an aspect of the invention there is provided audio signal processing apparatus comprising: a receiver for receiving a set of decimated subband signals at a decimated sample rate representing an audio signal at a first sampling frequency and having a maximum frequency not exceeding a threshold frequency being lower than half the first sampling frequency by a first frequency margin, the decimated subband signals being frequency shifted to a frequency interval being a multiple of a frequency interval from zero to half the decimated sample frequency and subsequently decimated by a decimation factor; and a synthesizer for synthesizing an audio output signal at the first sampling frequency from the set of decimated subband signals; the synthesizer comprising: an upsampler for upsampling the decimated subband signals to the first sampling frequency to generate upsampled subband signals; a second frequency shifter for applying a reverse frequency shift to the upsampled subband signals, the reverse frequency shift for a first decimated subband signal resulting in the first decimated subband signal being shifted to a frequency range corresponding to the frequency range of the decimated subband signal in the audio signal prior to frequency shifting and decimation; a subband merger for merging, following the application of the reverse frequency shift, the upsampled subband signals to generate a merged audio signal; a set of subband filters for filtering the upsampled processed subband signals to attenuate upsample alias spectra for each subband, each filter of the set of filters having a bandwidth not exceeding half the first sampling frequency.

According to an aspect of the invention method of audio signal processing comprising: receiving an audio signal sampled at a first sampling frequency, the audio signal having a maximum frequency not exceeding a threshold frequency being lower than half the first sampling frequency by a first frequency margin; a filter bank generating subband signals for the audio signal, the filter bank comprising a set of overlapping sub-filters providing a set of subbands; applying a frequency shift to at least one subband of the set of subbands; decimating the subband signals by a decimation factor resulting in decimated subband signals having a decimated sample frequency equal to the first sampling frequency divided by the decimation factor, the decimated sample frequency being at least twice a bandwidth of each of the overlapping sub-filters; and wherein the frequency shift for a subband shifts the subband to a frequency interval being a multiple of a frequency interval from zero to half the decimated sample frequency.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

The following description focuses on embodiments of the invention applicable to an effective processing of a digitized speech signal, and in particular to echo cancellation for a speech application. However, it will be appreciated that the invention is not limited to this application but may be applied to many other audio signals and audio applications.

As mentioned, it is known to divide an audio signal into a few subband signals corresponding to different frequency bands of the audio signal. The division is typically into two subbands and the following description will focus on embodiments wherein the audio signal is divided into two subbands which are then processed individually and separately.

Following the division into subbands (and specifically into two subbands) the signals may be decimated in order to reduce the complexity and resource demand of the subsequent processing. Due to the filters dividing the audio signals into subbands, this decimation will typically introduce aliasing where insufficiently attenuated signal components of other subbands are folded into the current subband. This aliasing is conventionally addressed by compensating and cancelling out the aliased components when synthesizing the corresponding full band output signal, i.e. when the processed subbands are combined to form a full bandwidth output audio signal. However, the Inventors have realized that whereas such compensation may remove the effect of aliasing in many systems, the aliasing may in other embodiments degrade performance. Further, the Inventors have realized that in contrast to the traditional approach of compensating aliasing as part of the synthesis, an approach is feasible which reduces aliasing in the individual subbands and that this may provide substantially improved performance in many embodiments, and indeed that such an approach may even provide substantially improved performance for systems that also include aliasing compensation as part of the synthesis operation.

Figure 1:
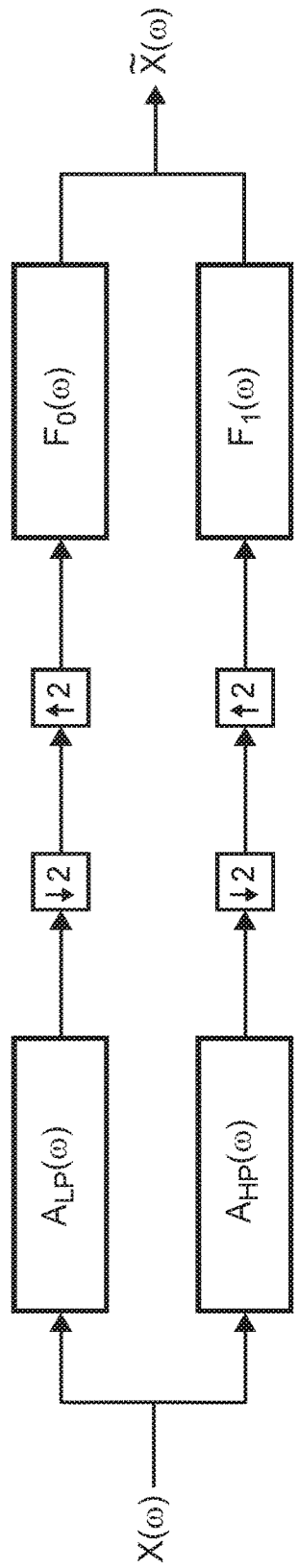
FIG. 1 illustrates an example of an audio subband processing approach.

In more detail, the prior art approach of FIG. 1 may be considered. The figure illustrates a typical prior art approach which uses critically sampled filter banks with analysis and synthesis band filters that are matched such that aliasing in the analysis bank is compensated in the synthesis bank. Further description may e.g. be found in e.g. P. P. Vaidyanathan, Multirate systems and filter banks, Prentice Hall 1993.

The system of FIG. 1 uses an analysis filter bank with analysis filters $A_{LP}(\omega)$ and $A_{HP}(\omega)$ and a synthesis filter bank with synthesis filters $F_0(\omega)$ and $F_1(\omega)$. Further, the cross-over between analysis filters is at half the sampling rate of the audio signal $X(\omega)$ and the output of the filters are decimated by a factor of 2. The decimated subband signals may be processed individually but are in the example of FIG. 1 shown to be fed directly to upsamplers being part of the synthesizing operation. The upsampling factor corresponds to the decimation factor of the analysis decimators thereby restoring the sampling frequency to the input sampling frequency.

Figure 2:
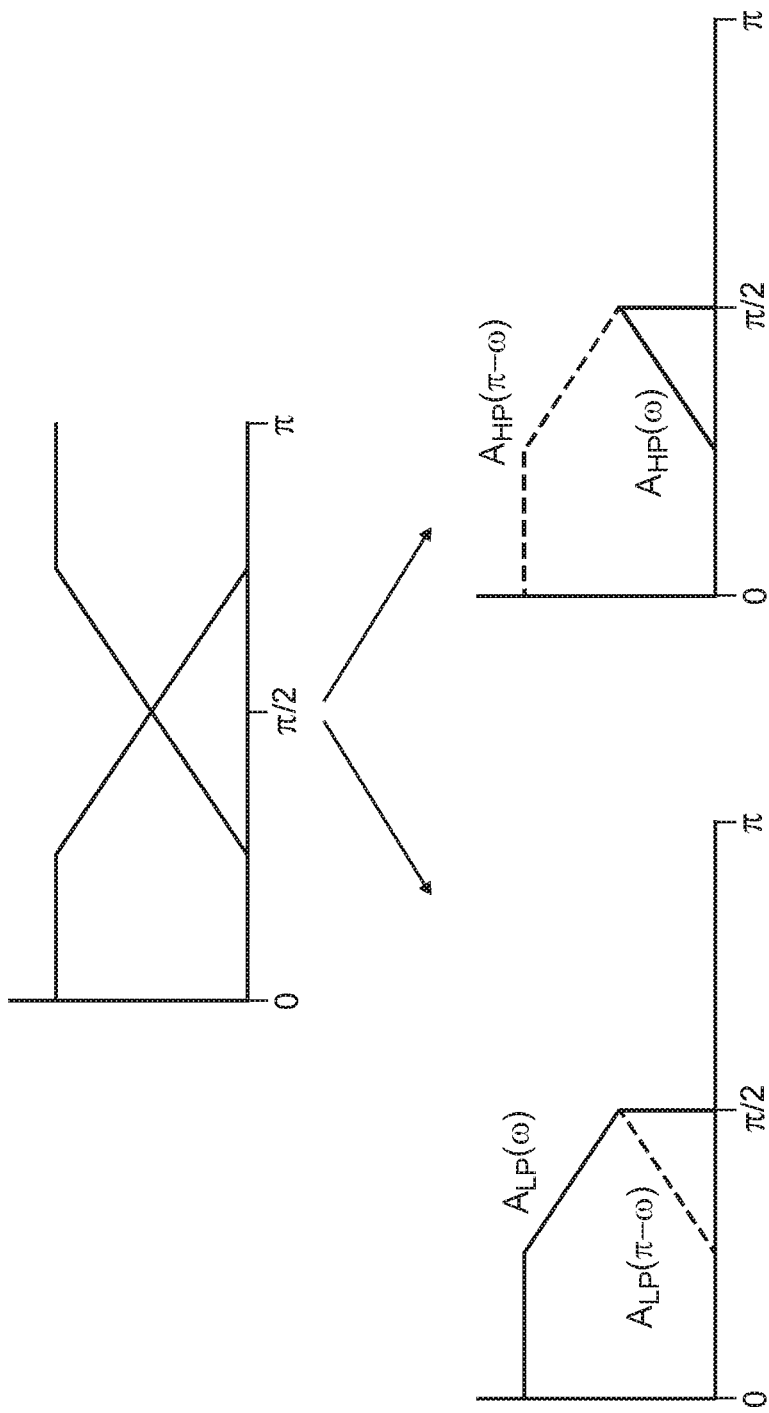
FIG. 2 illustrates an example of frequency spectra of signals of the audio subband processing approach of FIG. 1.

An example of the amplitude characteristics of the analysis filters are shown in FIG. 2 which first shows the amplitude characteristics followed by the resulting characteristics following the decimation. The solid lines represent the non-aliased contributions, whereas the dashed lines represent the aliased distributions. The frequency is represented by the normalized radian frequency for the sampling rate of the input signal (i.e. $f_{s1}=2\pi$ where $f_0$ is the sampling frequency of the input audio signal, also referred to as the first sampling frequency).

As illustrated in FIG. 2, the part of the frequency characteristic of the low pass analysis filter $A_{LP}(\omega)$ below $\pi/2$ is unaffected as $\pi/2$ corresponds to the Nyquist frequency for the decimated signal. However, due to the decimation, the amplitude characteristic above $\pi/2$ is folded back into the frequency band below the Nyquist frequency, i.e. it is folded around the Nyquist frequency of $\pi/2$. As a result, the subband signal will include significant alias signal components.

Similarly, for the high frequency subband, the part of the frequency characteristic of the high pass analysis filter $A_{HP}(\omega)$ below $\pi/2$ is unaffected whereas the amplitude characteristic above $\pi/2$ is folded back into the frequency band below the Nyquist frequency, i.e. it is folded around the Nyquist frequency of $\pi/2$. As a result, the high frequency subband signal will also include significant alias signal components. It should be noted that the output of the high-band after down sampling mostly consists of aliased terms that fold back to non-aliased terms after upsampling.

It should also be noted that FIG. 2 illustrates only signal components of the respective subbands in the frequency bands of $[0, \pi/2]$.

Thus, as the division into subbands requires an overlap between the filters (in order not to ignore signal components in the overlap region), the generated decimated subbands will inherently include a substantial amount of aliased components from other subbands. Indeed, the filter banks are designed to have a complementary power response resulting in a flat overall amplitude response. The attenuation at the Nyquist frequency for the decimated subband signals is accordingly only 3 dB and thus alias components around this frequency are inherently only attenuated by around 3 dB.

Analytically, the decimated outputs of the analysis filters when fed a signal $X(\omega)$ can be expressed as:

$$X_L(\omega)=A_{LP}(\omega)X(\omega)+A_{LP}(\pi-\omega)X(\pi-\omega)$$

and $$X_H(\omega)=A_{HP}(\omega)X(\omega)+A_{HP}(\pi-\omega)X(\pi-\omega).$$

After upsampling and summation being performed in the synthesis, the resulting output signal is given by:

$$\tilde{X}(\omega)=A_{LP}(\omega)F_0(\omega)X(\omega)+A_{LP}(\pi-\omega)F_0(\omega)X(\pi-\omega)+A_{HP}(\omega)F_1(\omega)X(\omega)+A_{HP}(\pi-\omega)F_1(\omega)X(\pi-\omega)$$

As can be seen from this, it is possible to set $F_0(\omega)=A_{HP}(\pi-\omega)$ and $F_1(\omega)=A_{LP}(\pi-\omega)$, resulting in the aliasing terms being cancelled. This results in:

$$\tilde{X}(\omega)=A_{LP}(\omega)A_{HP}(\pi-\omega)X(\omega)-A_{HP}(\omega)A_{LP}(\pi-\omega)X(\omega)$$

Thus, by designing the filters $A_{LP}(\omega)$ and $A_{HP}(\omega)$ appropriately a desired linear response can be achieved (ref. e.g. P. P. Vaidyanathan, Multirate systems and filter banks, Prentice Hall 1993).

For example using an odd ordered halfband elliptic low-pass filter $A_{LP}(\omega)$ and its power complementary high-pass filter $A_{HP}(\omega)$, the output signal can be given by:

$$\tilde{X}(\omega)=A(\omega)X(\omega),$$

where $A(\omega)$ is an all-pass filter.

Accordingly, in this case the amplitude characteristic for the input signal, e.g. the desired speech, remains constant. The phase distortion (around the cross-over frequency) is typically present but this is acceptable for many applications such as specifically many speech processing algorithms. However, at the crossover frequency the low-pass and high-pass filter only provide an attenuation of 3 dB and as a result there will be considerable aliasing present in the subbands. However, this is effectively compensated or cancelled in the synthesis stage and therefore the approach is used for many practical applications.

However, the Inventors have realized that whereas the alias compensation performed as part of the synthesis may provide acceptable performance in many scenarios, the presence of the alias components in the subband signals may in many applications still degrade performance, and in some cases even to an unacceptable degree which renders the approach unusable.

Figure 3:
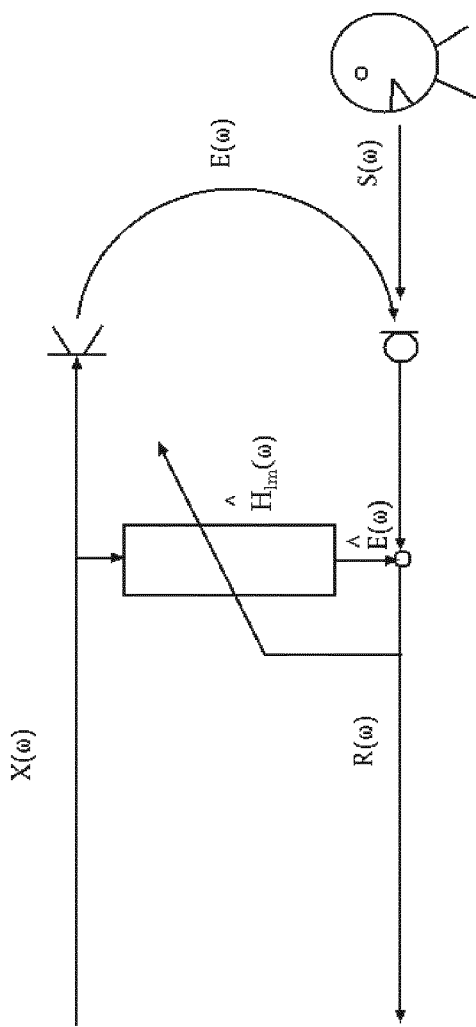
FIG. 3 illustrates an example of an echo cancellation system.

One particular example is for echo-cancellers. FIG. 3 illustrates an example of an echo-canceller wherein a received signal may comprise both a desired speech signal $S(\omega)$ and an undesired echo component $E(\omega)$ which results from the rendering of a loudspeaker signal $X(\omega)$. The echo component $E(\omega)$ is given as the loudspeaker signal $X(\omega)$ modified by the response of the signal path from the loudspeaker to the microphone (and including characteristics of these as well as any associated signal circuitry). Thus, $$E(\omega)=X(\omega)H_{lm}(\omega),$$

where $H_{lm}(\omega)$ is the acoustic path between the loudspeaker and the microphone.

The adaptive filter $\hat{H}_{lm}(\omega)$ tries to estimate the acoustic path $H_{lm}(\omega)$ such that when the loudspeaker signal $X(\omega)$ is applied to it, it provides an estimate of the echo $\hat{E}(\omega)$. A residual signal is obtained by subtracting the estimated echo from the microphone signal i.e.

$$R(\omega)=S(\omega)+(E(\omega)-\hat{E}(\omega)).$$

The residual signal is used to update the filter during time intervals in which there is no speech i.e. where $S(\omega)=0$.

Typically for acoustic echo cancellation the adaptive filter has to be designed such that the so-called Echo Return Loss Enhancement (ERLE) is at least 20 dB. ERLE is defined as $$ERLE = 10\log_{10}\frac{|E(\omega)-\hat{E}(\omega)|^2}{|E(\omega)|^2}.$$

In typical acoustic circumstances, this will as a typical example require a filter length of at least 2048 coefficients in the time domain for a bandwidth of 8 kHz. This means that the frequency resolution has to be at least 4 Hz, which indicates that there can be significant changes in $H_{lm}(\omega)$ over 4 Hz. For higher speech bandwidths, substantially longer filters are required. For example, for a bandwidth of 16 kHz and thus double the bandwidth and twice the sample rate, a filter length is required of at least 4096 coefficients in the time domain in order to address the same echo duration. However, typically the echo is much shorter in the range from 8 kHz to 16 kHz than it is from 0 to 8 kHz. Therefore, if the processing is instead performed in two separate bands, one from 0 to 8 kHz and one from 8 kHz to 16 kHz, an adaptive filter of 2048 coefficients may be used for the first band and a filter of typically 512 coefficients can be used for the second band. Thus, a significant reduction in complexity can be achieved.

Therefore, in the system of FIG. 3, the loudspeaker signal $X(\omega)$ and the captured microphone signal $S(\omega)+E(\omega)$ may be divided into two subbands using the approach of FIGS. 1 and 2. The adaptive filter $\hat{H}_{lm}(\omega)$ may similarly be divided into a low frequency filter applied to the low frequency subband and a high frequency filter applied to the high frequency subband. The resulting output signal $R(\omega)$ is accordingly generated in two individual subbands and the updating of each sub-filter may be based on the residual signal in that subband. Further, an echo cancelled full rate output signal may be provided by applying the synthesis part of FIG. 1 to the generated two subbands of $R(\omega)$.

As realized by the Inventors, the effects of the aliasing terms on the adaptive filters applied in the individual bands after downsampling may result in degradation despite the alias compensation included when synthesizing the output audio signal.

Using the indexes LP and HP to refer to respectively the low frequency subband and the high frequency subband, the following expressions can be derived for the situation where convergence of the adaptive filter has occurred (corresponding to the residual signal being zero and thus the output of the adaptive filter being equal to the captured signal). Specifically, setting:

$$\hat{E}_{LP}(\omega) = E_{LP}(\omega)$$

leads to $$(A_{LP}(\omega)X(\omega) + A_{LP}(\pi-\omega)X(\pi-\omega))\hat{H}_{LP}(\omega) =$$
$$A_{LP}(\omega)H_{lm}(\omega)X(\omega) + A_{LP}(\pi-\omega)H_{lm}(\pi-\omega)X(\pi-\omega).$$

Thus:

$$\hat{H}_{LP}(\omega) = \frac{A_{LP}(\omega)H_{lm}(\omega)X(\omega) + A_{LP}(\pi-\omega)H_{lm}(\pi-\omega)X(\pi-\omega)}{A_{LP}(\omega)X(\omega) + A_{LP}(\pi-\omega)X(\pi-\omega)}$$

$$\hat{H}_{LP}(\omega) = \alpha(\omega)H_{lm}(\omega) + (1-\alpha(\omega))H_{lm}(\pi-\omega),$$

with $$\alpha(\omega) = \frac{A_{LP}(\omega)X(\omega)}{A_{LP}(\omega)X(\omega) + A_{LP}(\pi-\omega)X(\pi-\omega)}.$$

Thus, the estimate of the echo in the low frequency subband consists of a weighted sum of the non-aliased contribution $H_{lm}(\omega)$ and an aliased contribution $H_{lm}(\pi-\omega)$. Note that in the specific example, as soon $\omega$ and $\pi-\omega$ differ by more than 4 Hz there may be significant differences between $H_{lm}(\omega)$ and $H_{lm}(\pi-\omega)$.

A problem is that $\alpha(\omega)$ is data dependent and (for typical speech applications) varies rapidly in time. In fact, in practice $\alpha(\omega)$ varies much faster than the adaptive filter can track. As a result, the optimum solution will not be reached and both the aliased and non-aliased components will not be cancelled.

The same derivations can be made for the higher frequency subband by replacing $A_{LP}(\omega)$ by $A_{HP}(\omega)$. Thus, as for the lower frequency band, neither aliased or non-aliased terms will be cancelled. As a consequence there will tend to be very substantial echo contributions in the output signal around the crossover frequency (normally several hundreds of Hz). These echo contributions will include both aliased and non-aliased contributions. (The latter, because the adaptive filters for both bands work independently, and the aliasing contributions do not perfectly cancel each other). Thus, substantial degradation may be introduced by the subband processing in this case.

As another example, individual speech encoding may be applied to a speech signal in different subbands. For example, a CELP encoding of a frequency band up to 8 kHz may be performed whereas the encoding of the speech component in the frequency band from 8 kHz to 16 kHz may be by a low complexity spectral encoding. In such, a scenario, the cross-subband aliasing will result in coding artifacts due to the non-linear nature of CELP encoding, and accordingly the aliasing cannot be completely cancelled at a decoding end.

Figure 4:
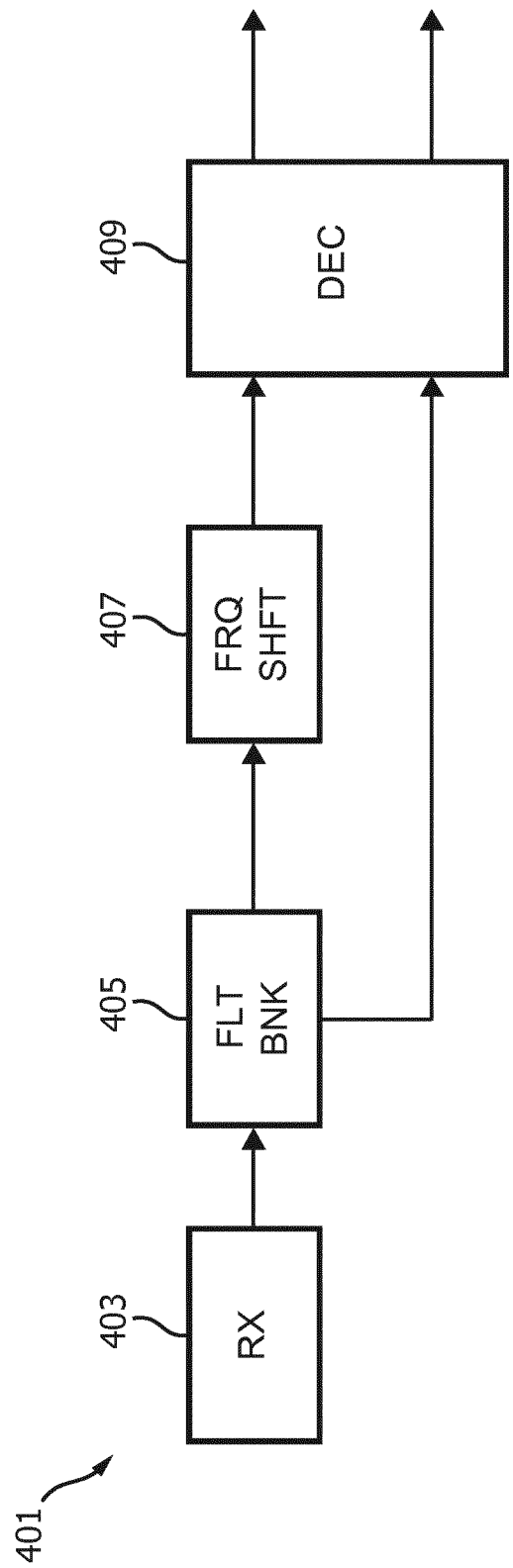
FIG. 4 illustrates an example of a subband generator for an audio subband processing system in accordance with some embodiments of the invention.

FIG. 4 illustrates an approach in which the described issues may be mitigated. FIG. 4 specifically illustrates a subband generator 401 for an audio processing apparatus.

The subband generator 401 corresponds to the analysis part of the system of FIG. 1 except for the differences described in the following.

The subband generator 401 comprises a receiver 403 which receives the audio signal. The audio signal is sampled at a frequency in the following referred to as the first sampling frequency. In contrast to the system of FIG. 2, the signal components of the audio signal is limited to a frequency band which is below a threshold frequency that is lower than the Nyquist frequency for the first sampling frequency, i.e. the maximum frequency of the audio signal is below the Nyquist frequency by a given margin. The exact margin may depend on the specific preferences and requirements of the individual embodiment. However, in many embodiments, the maximum frequency of the audio signal is restricted to be below a threshold frequency which is no more than 10%, or in some embodiments even e.g. 20% below half the first sampling frequency.

It will be appreciated that the maximum frequency may be considered as the frequency above the signal energy of frequency components is sufficiently low. For example, in many embodiments, the maximum frequency may be considered one above which signal components are at least 20 dB, or 30 dB, below a maximum amplitude. In some scenarios the maximum frequency may be considered the frequency for which the combined energy of signal components above the frequency is less than a given proportion of the total signal energy of the audio signal. The proportion may depend on the level of acceptable aliasing, and may typically be 5%, 1%, 0.5%, 0.1% or even lower.

In many embodiments, the audio signal may be a filtered audio signal and the maximum frequency may be a frequency for which the attenuation exceeds a given threshold. For example, the maximum frequency may be a frequency at which a (previous) filtering of the audio signal provides an attenuation of at least e.g. 20 dB, 30 dB or 40 dB.

It will be appreciated that the filtering may be an analog or digital filtering. For example, the filtering may be an analog low pass filtering performed prior to sampling. Specifically, the filtering may be an anti-alias filtering performed prior to sampling at the first sampling frequency. The maximum frequency of the audio signal may accordingly be a frequency at which the analog anti-alias filtering exceeds an attenuation of at least e.g. 10 dB, 20 dB, 30 dB or 40 dB.

In some embodiments, the receiver 403 may include a digital filter which is applied to a sampled audio signal in order to reduce the maximum frequency of the signal to provide a margin to the Nyquist frequency. For example, a digital filter may be applied which attenuates frequency components over, say 90% of the Nyquist frequency by at least e.g. 20 dB. Thus, in some embodiments it may be a frequency at which a digital (low pass) filter exceeds an attenuation of at least e.g. 10 dB, 20 dB, 30 dB or 40 dB. It will be appreciated that such a filter may be combined with the filter bank, e.g. by the filter bank filter for the highest subband providing an attenuation of frequencies above the maximum frequencies.

Thus, in contrast to conventional systems where signals having a bandwidth up to the Nyquist frequency may be accommodated, the system of FIG. 4 limits the maximum frequency to be below a threshold frequency which is less than the Nyquist frequency, often by around 10%. Thus, the system creates a margin or overhead in the frequency spectrum. For example, for a 32 ksps (Kilosample(s) per second) sampling rate and a 16 kHz bandwidth of a received speech signal, the system may create headroom around the Nyquist frequency by applying a low pass filter which provides a strong attenuation (say 20 dB) over a threshold frequency below the Nyquist frequency. For example, a threshold frequency of, say, 14 kHz may be used.

Thus, the sampled audio signal for which subbands are generated has a maximum frequency which does not exceed a threshold frequency which is below the Nyquist frequency by a suitable margin (e.g. 10%).

Figure 5:
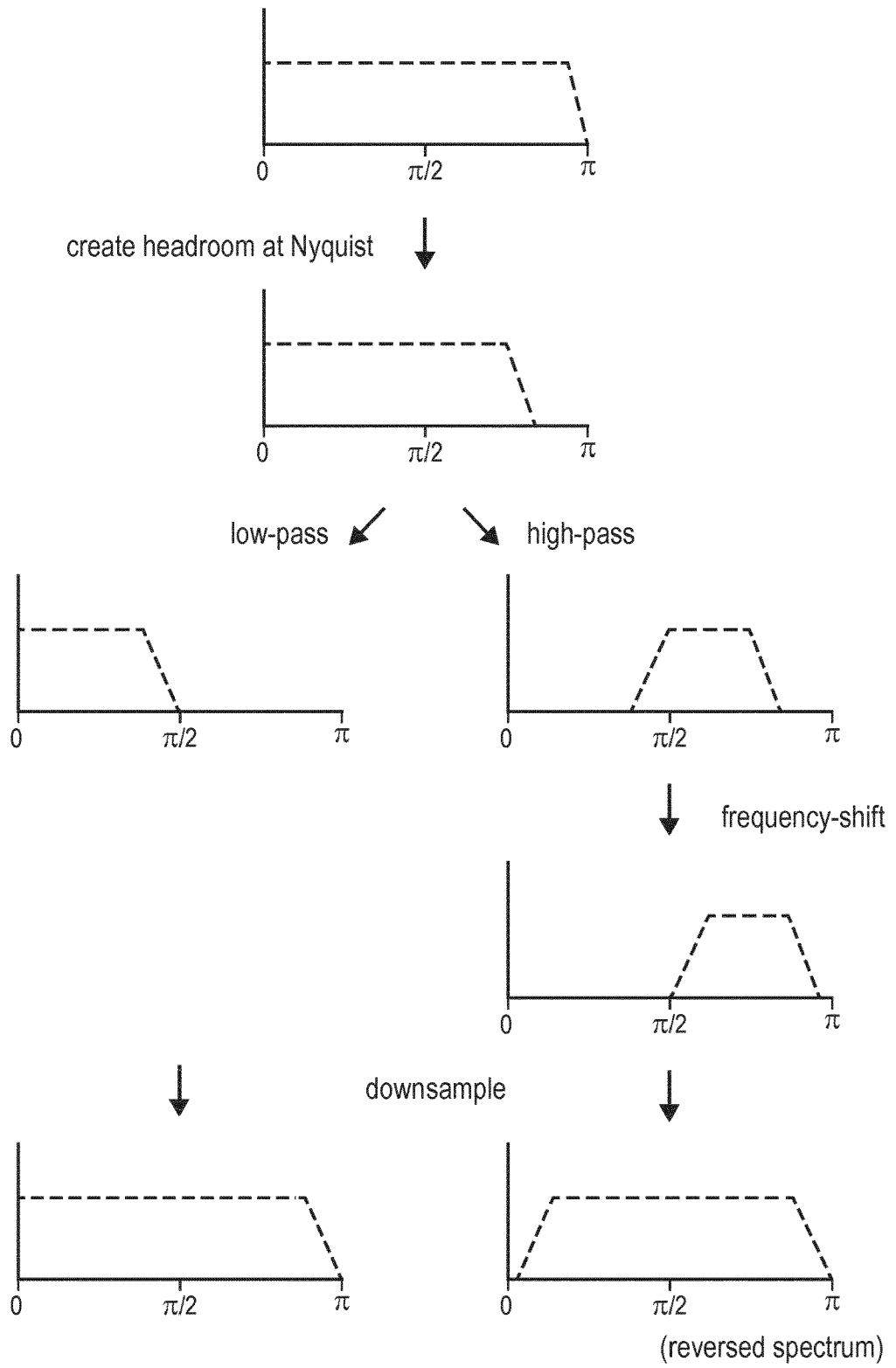
FIG. 5 illustrates an example of frequency spectra of signals of the audio subband processing approach of FIG. 4.

FIG. 5 illustrates spectra for various signals in the processing of the subband generator 401 of FIG. 1. It illustrates a first step of performing a filtering to ensure that the maximum frequency of the signal is below the Nyquist frequency of the input audio signal by a given suitable margin.

The receiver 403 is coupled to a filter bank 405 which is arranged to generate subband signals for the audio signal where the filter bank comprises a set of overlapping sub-filters providing a set of subbands. Each subband represents a frequency interval of the (input) audio signal.

In the specific example, the filter bank 405 includes two filters and the audio signal is split into two subbands. However, it will be appreciated that in other embodiments, the signal may be split into more subbands. Nevertheless, typically, the best trade-off is found for a relatively low number of subbands, and specifically the number of subbands does not exceed five in most embodiments.

The filter bank 405 comprises a plurality of overlapping filters which divide the frequency band (of the audio signal) into a plurality of subbands. The filters are overlapping such that the filters together include all signal components of the audio filter in at least one of the subbands (with an attenuation that does exceed a threshold of typically no more than 4-5 dB). The cross-over between the different filters, which is given as the frequency for which the attenuation of two neighboring filters is the same, is in most embodiments kept with an attenuation as close to 3 dB as possible (corresponding to an even split of a signal component at this frequency into the two subbands), and typically does not deviate from this by more than, say, 1 or 2 dB.

Neighboring filters of the filter bank 405 are in many embodiments generated to be substantially power complimentary. Thus, the combined attenuation of the filters is preferably substantially flat in many embodiments, and may specifically be flat within an accuracy of typically 1 dB or 2 dB. Thus, denoting the amplitude response of the two filters in the filter bank 405 of FIG. 4 as $A_{Lp}(\omega)$ and $A_{Hp}(\omega)$, the measure:

$$A_{Lp}(\omega)^2 + A_{Hp}(\omega)^2$$

is substantially constant for frequencies up to the threshold frequency/maximum frequency of the input audio signal.

It will be appreciated that some variation may occur in practical embodiments but typically the deviation is less than 1-2 dB across the frequency band. It will be appreciated that these considerations readily extend to more subbands, i.e. for n subbands/filters the measure $$A_1(\omega)^2 + A_2(\omega)^2 + A_3(\omega)^2 \ldots A_n(\omega)^2$$

is substantially constant across the frequency band.

The filter bank 405 is coupled to a frequency shifter 407 and to a decimator 409. The frequency shifter 407 is further coupled to the decimator 409.

The decimator 409 is arranged to decimate the sample frequency of each subband produced by the filter bank 405. Specifically, the decimator 409 may decimate the subband signals generated by the filter bank 405 by a decimation factor resulting in decimated subband signals which have a decimated sample frequency equal to the first sampling frequency divided by the decimation factor. In most embodiments, the decimation factor is an integer value but it will be appreciated that this is not essential.

Indeed, in most embodiments, the decimation factor is equal to the number of subbands generated by the filter bank 405. Thus, in the specific example, of FIG. 4 where two subbands are generated, the decimator 409 uses a decimation factor of two. Thus, the decimator generates a number of subbands which each has a sample frequency equal to the first sampling rate divided by the decimation factor, and specifically in FIG. 4 the decimator 409 generates two subbands, each with a sampling frequency of half the first sampling frequency.

In the example of FIG. 4, the lowest frequency subband (henceforth referred to as the lower subband) is fed directly to the decimator 409 for decimation. However, the highest frequency subband (henceforth referred to as the higher subband) is frequency shifted by the frequency shifter 407 before being fed to the decimator 409 for decimation. Thus, the decimation is performed on a frequency shifted version of the higher subband.

In the system, the subband filters of the filter bank 405 have a bandwidth which is lower than half the decimated sample rate, i.e. which is lower than the Nyquist frequency for the decimated frequency bands. Thus, in the system, the decimated sampling frequency, i.e. the first sampling frequency divided by the decimation factor, is larger than the bandwidth of each subband filter. The bandwidth may specifically be a 6 dB, 10 dB, 20 dB or even 30 dB bandwidth.

Accordingly, the cross-over frequency between the subband filters in the example of two filters, is less than the Nyquist frequency of the decimated signal, and specifically is less than a quarter of the first sampling frequency. Indeed, the cross-over frequency is lower by a sufficient threshold that it allows the attenuation of the signal to have reached a sufficiently high value at the decimated Nyquist frequency (the first sampling frequency divided by four).

This is illustrated in FIG. 5 which shows the low pass filtering with a cut-off frequency below the decimated Nyquist frequency (corresponding to $\pi/2$ for the first sampling frequency) and with a very high attenuation at the decimated Nyquist frequency. Indeed, the attenuation is sufficient for the alias components to be sufficiently attenuated. Typically the attenuation is no less than 10 dB, 20 dB or even higher.

As a result of this filtering, a lower subband signal is generated at the first sampling frequency which can readily be decimated by the decimator 409 without introducing (significant) alias components. This is illustrated in FIG. 5 which shows the resulting low pass filter (normalized with respect to the decimated sampling frequency following the downsampling/decimation).

However, due to the lower cross-over frequency, and thus the use of non-critically sampled filters, the higher frequency band would generate very substantial aliasing if directly decimated. However, as illustrated in FIG. 5, the higher subband is frequency shifted such that it falls into a frequency interval from $\pi/2$ to $\pi$ when normalized to the first sampling frequency. Further, as the bandwidth of the higher subband filter is lower than the decimated Nyquist frequency, the attenuation at both the Nyquist frequency for the first sampling frequency and the Nyquist frequency for the decimated sampling frequency can be very high. Indeed, typically the filter will be designed for the attenuation at these frequencies to be no less than 10 dB, 20 dB or even higher.

Further, when the frequency shifted higher subband is subsequently decimated, the band will alias to the frequency interval from 0 to the decimated Nyquist frequency. Thus, a base-band representation of the higher subband is generated. Furthermore, due to attenuation of the higher subband filter at the frequencies that are shifted to respectively the Nyquist frequency of the first sampling frequency and the Nyquist frequency of the decimated sampling frequency, this decimation does not result in any (significant) alias components from other bands being introduced to the base-band representation.

Indeed, the subband filters of the filter bank 405 provide a high attenuation at frequencies which following the frequency shift will be a multiple of half the decimated sample frequency. The attenuation is in most embodiments at least 6 dB for these frequencies, and often 10 dB, 20 dB or even 30 dB.

It should be noted that due to the base-band representation resulting from the decimation and resulting aliasing into base-band, the spectrum of the higher subband signal will be reversed in the base-band representation. It should further be noted that FIG. 5 illustrates only the spectra in the intervals being discussed (and not e.g. alias versions of the same signal, subband signal or filter characteristic and not negative frequencies).

Thus, as a result of the processing in the system of FIG. 4, two subband signals are generated that have very low levels of alias components from other subbands. These signals can accordingly be processed individually and separately without such alias components degrading the performance.

It will be appreciated that whereas the described system of FIG. 4 shifts the upper frequency subband to the frequency range from $\pi/2$ to $\pi$ (normalized to the first sampling frequency), it could in principle be shifted to other multiples of the base-band bandwidth from 0 to $\pi/2$. Indeed, in some embodiments, the frequency shift could directly shift the upper subband signal to the base-band from 0 to $\pi/2$.

It will also be appreciated that the approach is not limited to two subbands but can be applied to more subbands. In such cases, the frequency shift would seek to shift the bandwidth of the subband to fall within a multiple of the base-band given by the decimated Nyquist frequency, i.e. of $f_{s1}/d$ where $f_{s1}$ is the first sampling frequency and d is the decimation factor. For example, for three subbands, the two higher subbands may be shifted to a frequency interval having endpoints being a multiple of the first sampling frequency divided by 3. E.g. the middle subband may be shifted to the range from $\pi/3$ to $2\pi/3$ and the upper subband may be shifted from $2\pi/3$ to $\pi$; or indeed both subbands may be shifted to the interval from 0 to $\pi/3$.

Thus, in the approach oversampling is used instead of critical sampling in order to limit aliasing in the individual sub bands. This appears contradictory to the requirement that a flat amplitude characteristic is desired. However, the approach generates some headroom/margin at the top end of the spectrum which is then exploited. For example, for a super wideband speech signal with a sample frequency of 32 kHz, the full passband may be limited at 14 kHz and for full band with a sample frequency of 48 kHz the passband may be limited at 20 kHz. This headroom, in combination with a frequency shift, allows oversampling of each subband and substantially reduces subband aliasing while still allowing a substantially flat overall amplitude characteristic.

Thus, in the specific example, a band splitter is created with a crossover frequency below $\pi/2$, such that at $\omega=\pi/2$ the low pass has sufficient attenuation (more than 20 dB). The lower band can therefore safely be downsampled. Direct downsampling of the higher subband would suffer from significant aliasing. However before downsampling, the higher subband signal is fed to a frequency shifter such that the frequency band is shifted in frequency and the attenuation at $\omega=\pi/2$ and $\omega=\pi$ is sufficient (at least 20 dB) to avoid aliasing after downsampling (or at least keep this sufficiently low).

Accordingly, subbands without subband aliasing components are generated. Audio processing, such as speech enhancement algorithms, in particular adaptive filter algorithms, can now be applied on alias-free subband signals.

Figure 6:
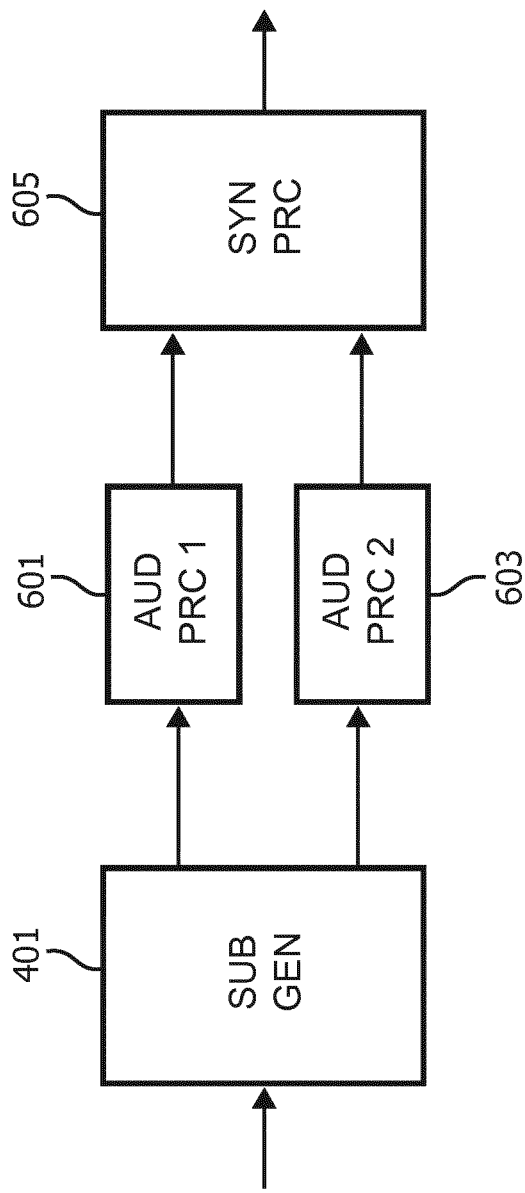
FIG. 6 illustrates an example of an audio subband processing system in accordance with some embodiments of the invention.

FIG. 6 illustrates an example of an audio processing system. The system comprises a subband generator 401 as described with respect to FIG. 4. Thus, the subband generator 401 receives an audio signal and generates two subband signals at a decimated frequency of half the first sampling frequency. Each of the two subbands is fed to a separate audio processors 601, 603 each of which performs a separate and individual processing of the audio signal. For example, the audio processors 601, 603 may perform a speech enhancement process. The processed subband signals are fed to a synthesizer 605 which is arranged to generate a single full band audio output signal from the processed subband signals. Thus, the synthesizer 605 merges the subband to generate a single output signal.

Figure 7:
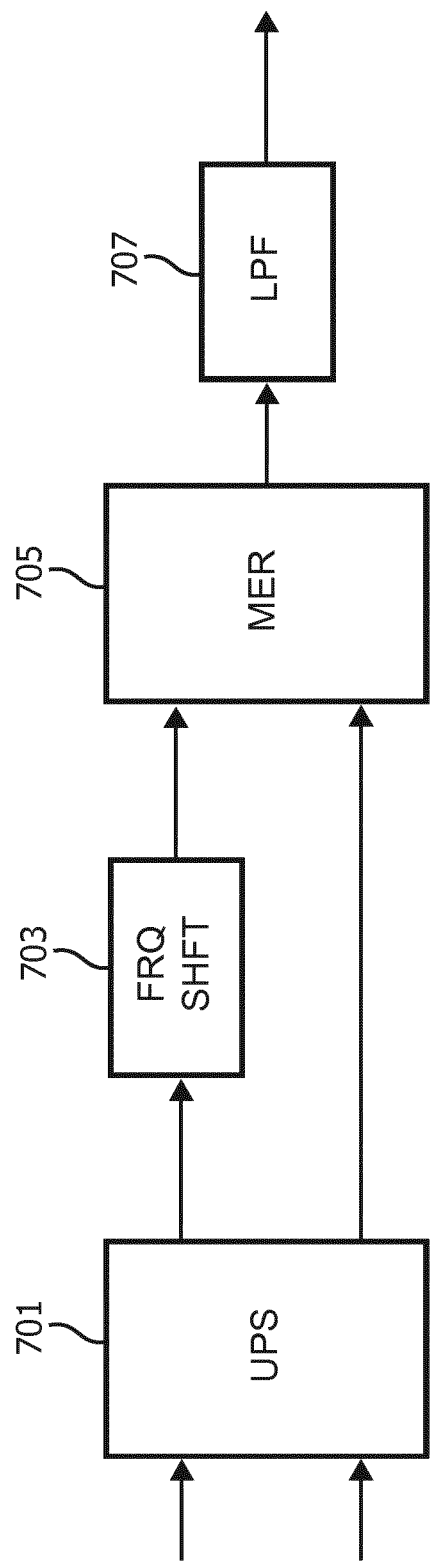
FIG. 7 illustrates an example of an audio signal synthesizer of an audio subband processing system in accordance with some embodiments of the invention.

The synthesizer 605 may essentially represent the transpose of the subband generator 401. An example of a synthesizer 605 complementary to the subband generator 401 of FIG. 4 is illustrated in FIG. 7.

In the example, the subbands signals received by the synthesizer 605, i.e. the processed subband signals are first upsampled to the first sampling frequency by an upsampler 701. Thus, the upsampler 701 performs upsampling of the individual subbands by an upsample factor corresponding to the decimation factor used by the decimator 409. In the specific example, an upsampling by a factor of 2 is accordingly performed.

The upsampling may for example be performed by zero stuffing, e.g. in the specific example an additional zero sample may be inserted between each received sample. In typical upsamplers, a zero stuffing is followed by a suitable filter which selects the appropriate frequency copy of the upsampled signal.

Specifically, when upsampling by zero stuffing or zero padding, a result of the extra samples is that the basic frequency spectrum is repeated in the frequency domain with a repetition factor corresponding to the decimated sample frequency. Thus, in the specific example, the upsampling to the first sampling frequency by zero stuffing results in the decimated spectrum being repeated with a repetition frequency corresponding to the first sampling frequency divided by the upsampling factor (corresponding to the decimation factor at the analysis end).

Thus, in the example where the decimation factor is two, the upsampled spectrum will be repeated with a frequency of $\pi$ (normalized to the first sampling frequency).

For the lower subband, this will result in the base band spectrum in the frequency range of 0 to $\pi/2$ being next to a copy of the spectrum from $\pi/2$ to $\pi$ (or if considering negative frequencies in the frequency range of $-\pi/2$ to $\pi/2$ being next to a copy of the spectrum from $\pi/2$ to $3\pi/2$). In order to maintain the subband components in the appropriate frequency band (i.e. the band prior to decimation), a low pass filter may be applied which selects the frequency spectrum from 0 to $\pi/2$. As the lower subband does not extend fully to $\pi/2$ (due to the oversampling rather than critical sampling of the filters), good results can be achieved from practical filters without excessive computational burden. However, for the higher subband, it is the copy of the spectrum from $\pi/2$ to $\pi$ which is selected as this corresponds to the frequency of the spectrum prior to decimation. Thus, instead of a low pass filter, a high pass filter is used to select the appropriate copy. This pass band filter has a bandwidth from $\pi/2$ to $\pi$ (in the base band interval from 0 to $\pi$) thereby removing the upsample alias copy from 0 to $\pi/2$. As a result, the subband signal from the subband generator 401 (prior to decimation but after frequency shifting) is recovered by a simple upsampling and filtering.

It will be appreciated that the described principle of upsampling and filtering (in a multiple of the first sampling frequency divided by the decimation factor) is generally applicable to any decimation factor and any subband. Specifically, for a higher sampling factor than two, the lower and upper subbands may be recovered using a low pass and high pass filter respectively whereas intermediate bands may be recovered using band pass filters. Indeed, as a low pass filter and high pass filter may be considered specific examples of band pass filters, the approach of upsampling followed by a bandpass filtering selecting the alias copy corresponding to the subband frequency band prior to decimation may be considered appropriate for all subbands.

It will be appreciated that whereas such filters may be part of the upsampler 701 this is not essential and that in other embodiments the filters may be applied at other parts of the signal path. For example, the filters may be part of a subsequent subband merging performed after frequency shifting. It will also be appreciated that the filters are preferably selected to provide a substantially flat amplitude/power response. Specifically, by selecting the filters as complementary power filters, a flat all-pass behavior can be obtained.

The synthesizer further comprises a second frequency shifter 703 which is arranged to apply a reverse frequency shift to the upsampled processed subband signals that were frequency shifted as part of the subband generation. In the specific example, the higher subband signal is accordingly fed to the second frequency shifter 703.

The second frequency shifter 703 applies a frequency shift (referred to as a reverse frequency shift) which for a given subband applies a shift that results in the subband being moved to the frequency range which is represented by the subband, i.e. it restores the signal components of the subband to the same frequency as they originally had in the input audio signal. Thus, the reverse frequency shift is such that the subband is shifted to the range of the subfilter which created the subband.

E.g. in the specific example, the first subband may cover a range from 0-7 kHz whereas the second subband may cover a range from 7-14 kHz. As both decimated and processed subband signals are represented by base-band signals, the second frequency shifter 703 may apply a reverse frequency shift which moves the higher subband signal from the base-band representation to the appropriate 7-14 kHz range.

The reverse frequency shift is arranged to reverse the combined frequency shift resulting from the frequency shift by the first frequency shifter 407. As previously discussed, the frequency shifting resulting from the decimation (i.e. the shift to base band) is compensated by the selection of the appropriate frequency copy by the filters.

For example, if the first frequency shifter 407 moves the higher subband into the range from $\pi/2$ to $\pi$ (normalized to the first sampling frequency) by applying a frequency shift of $f_{sh}$ and the aliasing by the decimator moves this to the pass band of 0 to π/2 (normalized to the first sampling frequency), then the second frequency shifter 703 may perform a frequency shift of $-f_{sh}$.

The output of the second frequency shifter 703 is fed to a subband merger 705 which is also coupled to the upsampler 701 from which it receives the lower subband signal. The subband merger 705 is arranged to merge the upsampled processed subband signals to generate a processed output audio signal with a sample rate corresponding to the input signal.

The subband merger 705 may directly combine the received subband signals as these are now positioned at the appropriate frequencies, i.e. the subband frequencies correspond to the frequency range of the input signal represented by each subband signal.

Indeed, in some embodiments, the subband merger 705 may simply be implemented as an adder summing the received subband signals. Specifically, simple adding may be performed if the appropriate filters (e.g. alias filters for band pass filtering the zero stuffed signals to select the appropriate frequency copies for the individual subband) have been employed in the upsampler. In other embodiments, more complex merging may be performed e.g. including filters that perform the band selection.

For example, filters that also compensate for the filtering of the subband filters of the filter bank 405 may be employed. Specifically, the merger may include a set of subband filters which are applied to the upsampled processed subband signals. A combiner may then combine the resulting filtered subband signals. In such an example, the subfilters may be arranged such that the cascade of the subband filter in the filter bank 405 and the corresponding subband filter in subband merger 705 is substantially the same for all subbands.

The output of the subband merger 705 is in the example fed to a low pass filter 707 which has a bandwidth (e.g. a 6 dB, 10 dB or 20 dB bandwidth) that is less than half the first sampling frequency. Thus, the low pass filter 707 may perform an upsample anti-alias filtering resulting in the upsampling not generating high frequency signal components despite performing a zero stuffing upsampling.

The output of the low pass filter 707 is accordingly a processed audio signal which has the same sample rate as the input audio signal. However, the processing of the audio signal has been performed individually and separately on each subband without introducing (unacceptable) degradation due to subband aliasing.

As described, the first frequency shifter 407 is arranged to shift the higher subbands such that these are moved to intervals that are a multiple of the frequency interval from zero to half the decimated sample frequency. The exact shift may vary between different applications and embodiments (or even for different signals or different subbands). However, in many embodiments, the shift is advantageously such that the subband is positioned centrally within such a frequency interval.

Thus, in many embodiments, the first frequency shifter 407 may be arranged to select the shift frequency such that a centre frequency of the subband is shifted to substantially the centre of an interval being a multiple of the fundamental interval from zero to half the decimated sample frequency.

Specifically, the frequency shift for a given subband may substantially be given as:

$$f_s = \frac{f_d}{4} + n\frac{f_d}{2} - f_m$$

where $f_d$ is the decimated sample frequency, $f_m$ is a centre frequency of the subband prior to frequency shifting, and n is an integer (n≥1).

In many embodiments, the frequency shift may be given substantially as above with a maximum deviation from the frequency $f_s$ of 10%, or even 5% or 1%, of a subband bandwidth.

Figure 8:
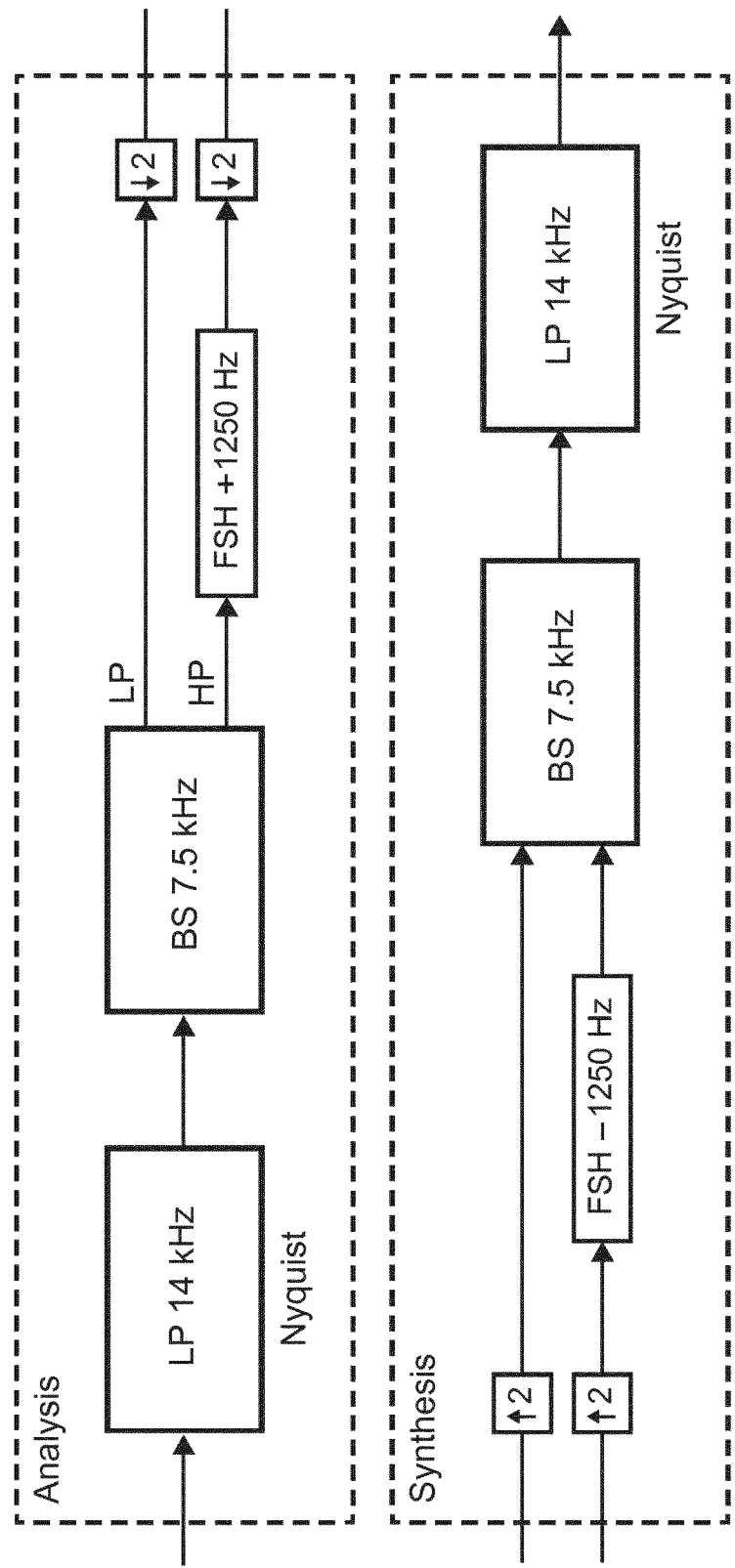
FIG. 8 illustrates an example of an audio subband processing system in accordance with some embodiments of the invention.

A specific example of an implementation of the described approach is illustrated in FIG. 8, which shows an analysis side (corresponding to the subband generator 401) and a synthesis side (corresponding to the synthesizer 605). The example is a speech processing super wideband system with a sample frequency of 32 kHz In the example, the analysis part, corresponding to the subband generator 401, includes the following specific approach:

Initial low pass filtering with a cutoff frequency at 14 kHz. This filter can for example be an elliptic filter.

A band splitter (implementing the filter bank 405) with a crossover frequency at 7.5 kHz.

A frequency shift of 1250 Hz in order to shift the centre frequency of the higher subband of (14 kHz–7.5 kHz)/2) =10.750 kHz to the centre frequency of the frequency interval from 8 kHz to 16 kHz (corresponding to the interval of π/2–π), i.e. to 12 kHz.

The downsamplers decimating the subband signals by a factor of 2.

In the synthesis part, the reverse operation is performed:
The received signals are upsampled by a factor of 2.
For the high band a frequency shift of –1250 Hz is applied as a direct frequency shift.
A band merger with the crossover at 7.5 kHz is applied.
A low-pass filter around Nyquist with a cutoff frequency at 14 kHz is applied.

It will be appreciated that the individual entities and processors can be implemented by any suitable approach.

Figure 9:
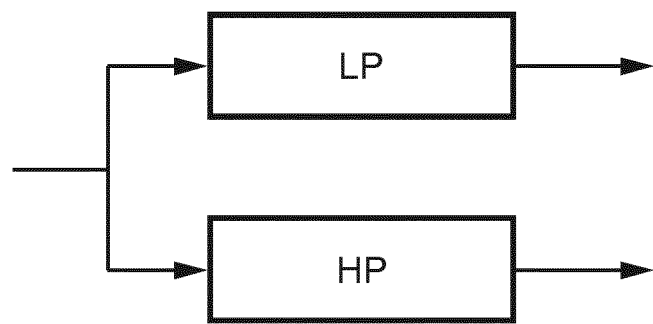
FIG. 9 illustrates an example of a filter bank for an audio subband processing system in accordance with some embodiments of the invention.

For example, for the filter bank 405, an odd-ordered elliptic low-pass filter at 7.5 kHz and its power complementary high-pass filter may be used as shown in FIG. 9.

Figure 10:
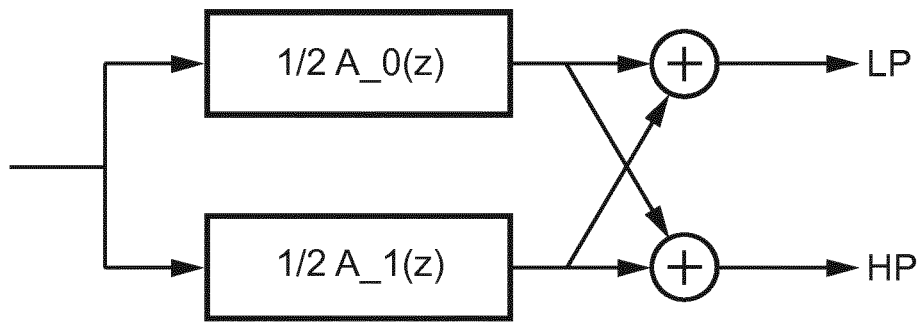
FIG. 10 illustrates an example of a filter bank for an audio subband processing system in accordance with some embodiments of the invention.

Such filters can e.g. be implemented with all-pass filters. In the case where two filters are power complementary filters, they share the same all-pass filters. The structure of FIG. 10 may e.g. be implemented with all-pass sections $A_0(z)$ and $A_1(z)$.

Figure 11:
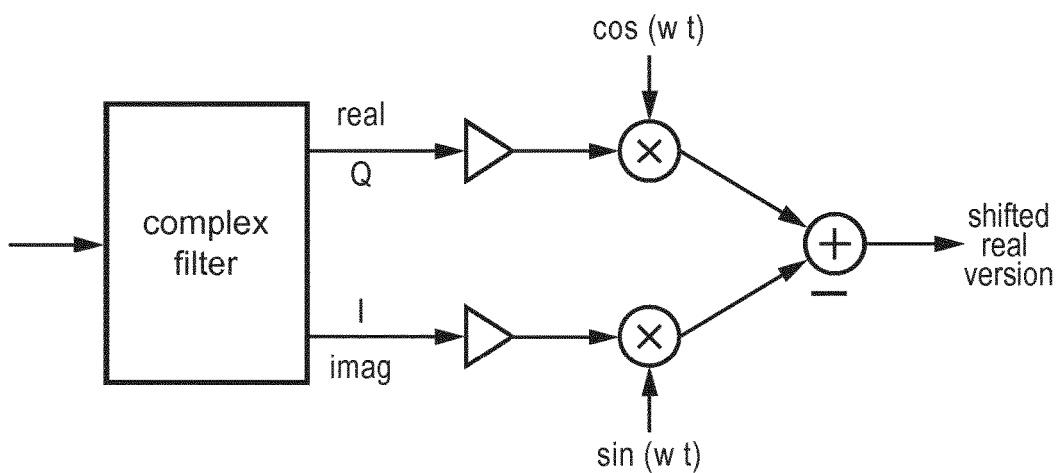
FIG. 11 illustrates an example of a frequency shifter for an audio subband processing system in accordance with some embodiments of the invention.

The frequency shifters can be realized using an analytic signal as illustrated in FIG. 11. An analytic signal is a complex (time) signal with the original signal forming the real part and the Hilbert transformed part forming the imaginary signal. In the frequency domain, such a signal has only contributions for positive frequencies. Multiplying this signal by $e^{i\omega_s t}$ shifts the spectrum by $\omega_s$. Taking the real part of this signal gives the original signal shifted by $\omega_s$. The complex filter can be designed both with FIR and IIR filters.

Figure 12:
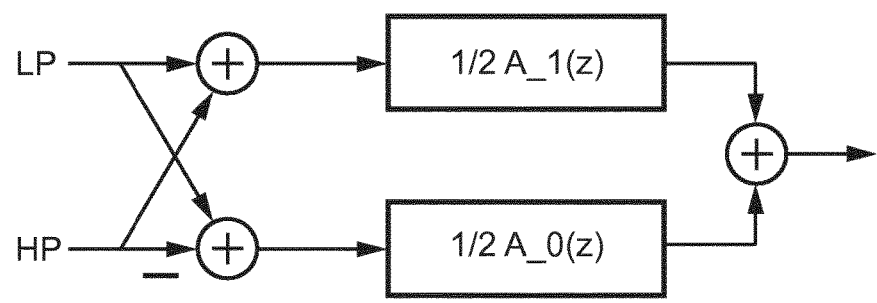
FIG. 12 illustrates an example of a filter bank for an audio subband processing system in accordance with some embodiments of the invention.

In the synthesis part, the same building blocks can be used. The subband merger 705 may e.g. be implemented as illustrated in FIG. 12.

The approach may be used in many different applications and may provide advantages for many different types of audio signals and audio processing.

However, the approach may in particular be highly suited for speech processing. Indeed, for speech, the characteristics tend to be very different in different bands, and the described approach allows a subband processing that may reflect and be adapted to such variations in characteristics. The effect is increasingly significant as the frequency band used to represent speech increases as is currently the trend.

Thus, as an example, the algorithm applied by the signal processors 601, 603 of FIG. 6 may be a speech processing algorithm, and may specifically be a speech enhancement processing algorithm. Due to the significantly different properties of speech in the two subbands (e.g. from 0-7.5 kHz and from 7.5-14 kHz), the signal processors 601, 603 may be arranged to apply different algorithms in different subbands.

As a specific example, take stationary noise suppression. With stationary noise suppression it is often tried to estimate the spectral amplitude of the background noise during silence and change the spectral amplitude of the input signal such that the spectral amplitude of the cleaned signal resembles the spectral amplitude of the desired signal, whereas the phase remains unaltered. The spectra are often computed by a short-time Fast Fourier Transform (STFFT) of overlapping Hanning windowed time signals. The required frequency resolution is determined by the frequency resolution of human hearing, which is high at low frequencies and low at high frequencies. Bandsplitting allows us to apply a stationary noise suppression algorithm in the lower band with a sufficient length of the STFFT to provide sufficient frequency resolution and a stationary noise suppression algorithm in the higher band with a smaller size STFFT that provides lower frequency resolution, but consequently a high time domain resolution.

Figure 13:
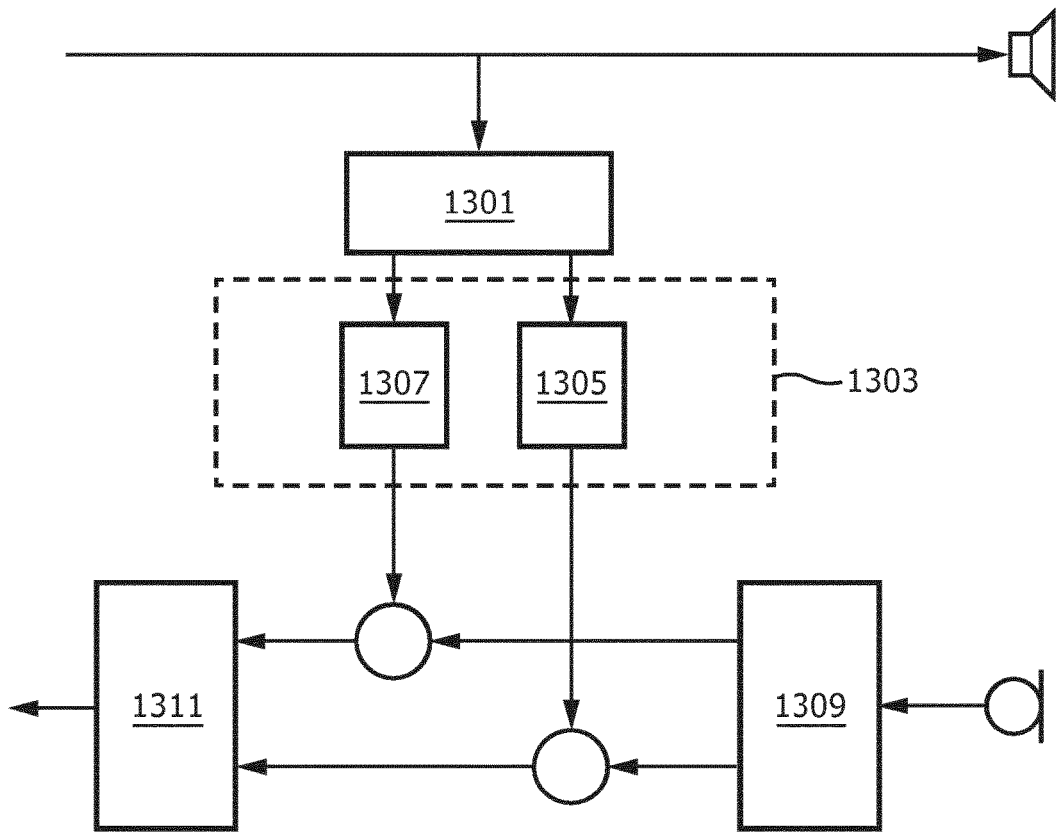
FIG. 13 illustrates an example of an echo canceller using a subband processing system in accordance with some embodiments of the invention.

In some embodiments, the signal processing algorithm may be an echo cancellation. FIG. 13 illustrates an example of the echo cancellation of FIG. 3 but modified to perform individual subband processing.

As can be seen, in the example, the loudspeaker signal $X(\omega)$ is fed to a first subband generator 1301 corresponding to the subband generator 401 of FIG. 4. The two resulting subband signals are fed to the echo cancellation filter 1303 which in this example is formed by two sub-echo-cancellation filters 1305, 1307 that each operate at the decimated frequency (i.e. at half the first sampling frequency). Thus, in the example, one sub-echo-cancellation filter is provided for each band.

Similarly, the received signal $S(\omega)+E(\omega)$ is divided into two subband signals by a second subband generator 1309 corresponding to the subband generator 401 of FIG. 4. The residual signal is generated individually for the two subbands by comparing the estimated and the received signals separately in each subband.

Further, each adaptive sub-echo-cancellation filter 1305, 1307 is updated based on the residual signal in each subband (e.g. using a Least Mean Square adaptive algorithm to minimize the power of the residual signal). Thus, the updating of the sub-echo-cancellation filters 1305, 1307 is performed individually in each subband, and indeed the echo cancellation is performed as two separate processes in the two subbands. This in particular allows the length of the adaptive sub-echo-cancellation filters 1305, 1307 to be different thereby allowing a substantial complexity decrease.

In the example, the residual signal is furthermore fed to a synthesizer 1311 in accordance with the example of FIG. 7. The synthesizer 1311 can merge the subbands of the residual signal thereby generating a full band echo cancelled speech signal.

In the above, various exemplary embodiments with a specific signal flow and order of operations have been described. However, it will be appreciated that there may be variations in the specific processing, and indeed that the order or sequence of the operations performed may be different in different embodiments. For example, as previously described, the subband filtering of the synthesis may be performed as part of the upsampling or as part of the merging of the subbands.

As another example, FIG. 4 illustrates an example wherein decimation is performed after frequency shifting. However, in some embodiments, decimation may possibly be performed prior to the frequency shifting or indeed as part of the frequency shifting.

In order to illustrate the approach, a FIR filter followed by a decimator achieving a decimation factor of two by keeping only the even numbered samples may be considered. Such a FIR filter could possibly be designed such that, from the point of view of the impulse response, all odd ordered coefficients are zero. In this case, it is possible to create a new FIR filter which only includes the non-zero coefficients and with the decimator being in front of the filter. This will result in the exact same output of the FIR filter but with lower complexity.

For example, for a number of coefficients N=5, the coefficients h0,h2,h4 are non-zero whereas h1=h3=0. Denoting the input by x and the output by y the following filter output may be generated:

$$y(n)=h(0)x(n)+h(1)x(n-1)+h(2)x(n-2)+h(3)x(n-3)+h(4)x(n-4)$$

$$y(n+1)=h(0)x(n+1)+h(1)x(n)+h(2)x(n-1)+h(3)x(n-2)+h(4)x(n-3)$$

$$y(n+2)=h(0)x(n+2)+h(1)x(n+1)+h(2)x(n)+h(3)x(n-1)+h(4)x(n-2)$$

$$y(n+3)=h(0)x(n+3)+h(1)x(n+2)+h(2)x(n+1)+h(3)x(n)+h(4)x(n-1)$$

and after the decimator:

$$y(n)=h(0)x(n)+h(1)x(n-1)+h(2)x(n-2)+h(3)x(n-3)+h(4)x(n-4)$$

$$y(n+2)=h(0)x(n+2)+h(1)x(n+1)+h(2)x(n)+h(3)x(n-1)+h(4)x(n-2)$$

Since h1=h3=0 we can write:

$$y(n)=h(0)x(n)+h(2)x(n-2)+h(4)x(n-4)$$

$$y(n+2)=h(0)x(n+2)+h(2)x(n)+h(4)x(n-2)$$

This is equivalent to a decimator in front of a filter with coefficients h(0), h(2), h(4). Thus, in the example, the decimation may be performed prior to the FIR filtering.

In some embodiments, a similar approach may be used for the frequency shifting. Specifically, if frequencies are selected to provide periodically repeating zero coefficients, the remaining coefficients may be applied to a decimated signal (possibly a partly decimated signal, i.e. decimation may be performed in two stages).

As a specific example of decimation being performed as part of the frequency shifting, the frequency shifter of FIG. 11 can be considered. In the example the frequency shifter is followed by a decimator but it can readily be seen that instead of the decimation selecting a subset of samples at the output of the frequency shifter, decimation may instead be performed in the individual paths. For example, the decimation may be performed on the individual paths at the input to the adder or indeed at the input to the multipliers (thus (two decimators will be needed, one in each path).

It will be appreciated that the above description for clarity has described embodiments of the invention with reference to different functional circuits, units and processors. However, it will be apparent that any suitable distribution of functionality between different functional circuits, units or processors may be used without detracting from the invention. For example, functionality illustrated to be performed by separate processors or controllers may be performed by the same processor or controllers. Hence, references to specific functional units or circuits are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units, circuits and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements, circuits or method steps may be implemented by e.g. a single circuit, unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc do not preclude a plurality. Reference signs in the claims are provided merely as a clarifying example shall not be construed as limiting the scope of the claims in any way.

The invention claimed is:

1. An audio signal processing apparatus comprising:
   a receiver,
       wherein the receiver is arranged to receive an audio signal,
       wherein the audio signal is sampled at a first sampling frequency,
       wherein the audio signal has a maximum frequency,
       wherein the maximum frequency does not exceed a threshold frequency,
       wherein the threshold frequency is lower than half the first sampling frequency by a first frequency margin;
   a filter bank,
       wherein the filter bank generates subband signals for the digital audio signal,
       wherein the filter bank comprises a set of overlapping sub-filters providing a set of subbands;
   a first frequency shifter, wherein the first frequency filter is arranged to apply a frequency shift to at least one subband of the set of subbands;
   a decimator,
       wherein the decimator is arranged to decimate the subband signals by a decimation factor resulting in decimated subband signals having a decimated sampling frequency equal to the first sampling frequency divided by the decimation factor,
       wherein the decimated sampling frequency is at least twice a bandwidth of each of the overlapping sub-filters; and
   wherein the frequency shift for a subband is arranged to shift the subband to a frequency interval which is a multiple of a frequency interval from zero to half the decimated sample frequency.

2. The audio signal processing apparatus of claim 1 further comprising a signal processor, wherein the signal processor is arranged to apply a signal processing algorithm to the audio signal by applying separate subband signal processing in each subband.

3. The audio signal processing apparatus of claim 2,
   wherein the signal processing algorithm is a speech processing algorithm,
   wherein the signal processor is arranged to apply different algorithms in different subbands.

4. The audio signal processing apparatus of claim 2,
   wherein the signal processing algorithm comprises applying an adaptive filter,
   wherein the signal processor is arranged to adapt the adaptive filter separately in different subbands.

5. The audio signal processing apparatus of claim 4,
   wherein the adaptive filter is an echo cancellation filter,
   wherein the cancellation filter is arranged to estimate an echo of the audio signal,
   wherein the echo cancellation filter comprising a sub-echo cancellation filter for each subband
   wherein the signal processor is arranged to determined estimated echo signals for each subband by applying a sub-echo cancellation filter to the decimated subband signal in each subband
   wherein the signal processor is arranged to determine an error signal for each subband by comparing the estimated echo signal in each subband to a captured audio signal comprising an echo of the audio signal
   wherein the signal processor is arranged to update each sub-echo cancellation filter in response to the error signal for the corresponding subband.

6. The audio signal processing apparatus of claim 2 further comprising a synthesizer, wherein the synthesizer is arrange to synthesize an audio output signal at the first sampling frequency from processed subband signals generated by the subband signal processing in each subband, the synthesizer comprising:
   an upsampler, wherein the upsampler is arranged to upsample the processed subband signals to the first sampling frequency to generate upsampled processed subband signals;

a second frequency shifter,
wherein the second frequency is arranged to apply a reverse frequency shift to the upsampled processed subband signals,
wherein the reverse frequency shift for a first subband results in the first subband being shifted to a frequency range of the sub- filter for the first subband;
a subband merger, wherein the subband merger is arranged to merge, following the application of the reverse frequency shift, the upsampled processed subband signals to generate a processed audio signal;
a set of subband filters, wherein the subband filters arranged to filter the upsampled processed subband signals to attenuate upsample alias spectra for each subband, wherein each filter of the set of filters has a bandwidth not exceeding half the first sampling frequency.

7. The audio signal processing apparatus of claim 6,
wherein the subband merger comprises at least one of the set of subband filters, and a combiner,
wherein the combiner is arranged to generate the processed audio signal by combining the upsampled processed signals subband following the subband filtering.

8. The audio signal processing apparatus of claim 1 wherein the frequency shift for a first subband is substantially given as:

$$f_s = \frac{f_d}{4} + n\frac{f_d}{2} - f_m$$

wherein fd is the decimated sample frequency, wherein fm is a center frequency of the first subband prior to frequency shifting, and n is an integer (n≥1).

9. The audio signal processing apparatus of claim 1 wherein an attenuation of a sub-filter for a first subband is no less than 6 dB at a frequency of a multiple of half the decimated sample frequency shifted by a value corresponding to the frequency shift.

10. The audio signal processing apparatus of claim 1 wherein the filter bank is formed by a set of substantially power complementary sub-filters.

11. The audio signal processing apparatus of claim 1, wherein each filter of the set of overlapping sub-filters has a 6 dB bandwidth not exceeding half a decimation frequency.

12. The audio signal processing apparatus of claim 1 wherein the threshold frequency is no less than 10% lower than half the first sampling frequency.

13. An audio signal processing apparatus comprising:
a receiver,
wherein the receiver is arranged to receive a set of decimated subband signals at a decimated sample rate,
wherein the set of decimated subband signals represents an audio signal at a first sampling frequency,
wherein the set of decimated subband signals has a maximum frequency not exceeding a threshold frequency,
wherein the threshold frequency is lower than half the first sampling frequency by a first frequency margin,
wherein the decimated subband signals is frequency shifted to a frequency interval which is a multiple of a frequency interval from zero to half the decimated sample frequency and subsequently decimated by a decimation factor; and
a synthesizer, wherein the synthesizer is arranged to synthesize an audio output signal at the first sampling frequency from the set of decimated subband signals, the synthesizer comprising:
an upsampler, wherein the upsampler is arranged to upsample the decimated subband signals to the first sampling frequency so as to generate upsampled subband signals;
a frequency shifter, wherein the frequency shifter is arranged to apply a reverse frequency shift to the upsampled subband signals, wherein the reverse frequency shift for a first decimated subband signal results in the first decimated subband signal being shifted to a frequency range corresponding to the frequency range of the decimated subband signal in the audio signal prior to frequency shifting and decimation;
a subband merger, wherein the subband merger is arranged to merge, following the application of the reverse frequency shift, the upsampled subband signals to generate a merged audio signal;
a set of subband filters, wherein the subband filters arranged to filter the upsampled processed subband signals to attenuate upsample alias spectra for each subband, wherein each filter of the set of filters has a bandwidth not exceeding half the first sampling frequency.

14. A method of audio signal processing comprising:
receiving an audio signal sampled at a first sampling frequency, wherein the audio signal has a maximum frequency not exceeding a threshold frequency, wherein the threshold frequency is lower than half the first sampling frequency by a first frequency margin;
a filter bank,
wherein the filter bank generates subband signals for the audio signal,
wherein the filter bank comprises a set of overlapping sub-filters providing a set of subbands;
applying a frequency shift to at least one subband of the set of subbands;
decimating the subband signals by a decimation factor resulting in decimated subband signals having a decimated sample frequency,
wherein the decimated sample frequency is equal to the first sampling frequency divided by the decimation factor,
wherein the decimated sample frequency being at least twice a bandwidth of each of the overlapping sub-filters; and
wherein the frequency shift for a subband shifts the subband to a frequency interval which is a multiple of a frequency interval from zero to half the decimated sample frequency.

15. A device comprising computer program configured to perform all the steps of claim 14 when said computer program is running on a processor circuit.

* * * * *